(12) United States Patent
Lim et al.

(10) Patent No.: US 12,704,661 B2
(45) Date of Patent: Aug. 11, 2026

(54) DISPLAY MODULE AND TILING DISPLAY DEVICE HAVING AN ANTIREFLECTION LAYER

(71) Applicant: Samsung Display Co., Ltd., Yongin-si (KR)

(72) Inventors: Ho Lim, Suwon-si (KR); Taemin Kim, Hwaseong-si (KR); Donggeun Shin, Hwaseong-si (KR); Gihoon Yang, Hwaseong-si (KR); Seulgee Lee, Seoul (KR); Seunghee Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 591 days.

(21) Appl. No.: 17/588,747

(22) Filed: Jan. 31, 2022

(65) Prior Publication Data

US 2022/0320471 A1 Oct. 6, 2022

(30) Foreign Application Priority Data

Apr. 5, 2021 (KR) ........................ 10-2021-0044186

(51) Int. Cl.
*G02B 1/115* (2015.01)
*H10K 59/122* (2023.01)
(Continued)

(52) U.S. Cl.
CPC ........... *G02B 1/115* (2013.01); *H10K 59/873* (2023.02); *H10K 59/875* (2023.02);
(Continued)

(58) Field of Classification Search
CPC .... H10K 50/86; H10K 50/125; H10K 59/122; H10K 59/38; H10K 59/873;
(Continued)

(56) References Cited

U.S. PATENT DOCUMENTS 5,609,773 A * 3/1997 Usui ........................ H05K 3/06 216/100
9,257,663 B2 2/2016 Nakamura et al.
(Continued)

FOREIGN PATENT DOCUMENTS

CN 104509211 A 4/2015
CN 111599800 A 8/2020
(Continued)

OTHER PUBLICATIONS

Extended European Search Report for Application No. 22166191.1-1020 dated Aug. 8, 2022 enumerating the above listed references in the Extended European Search Report.
(Continued)

*Primary Examiner* — Wael M Fahmy
*Assistant Examiner* — Tiberiu Dan Onuta
(74) *Attorney, Agent, or Firm* — CANTOR COLBURN LLP

(57) ABSTRACT

A display module includes a display panel, an optical layer disposed on the display panel, an antireflection layer disposed on the optical layer, and the antireflection layer includes a first layer including silicon oxynitride, a second layer disposed on the first layer and including silicon nitride, and a third layer disposed on the second layer and including polysilazane.

13 Claims, 9 Drawing Sheets

(51) Int. Cl.

| | |
|---|---|
| ***H10K 59/38*** | (2023.01) |
| ***H10K 59/80*** | (2023.01) |
| ***H10K 102/00*** | (2023.01) |
| ***H10W 90/00*** | (2026.01) |

(52) U.S. Cl.
CPC ....... *H10K 59/8791* (2023.02); *H10K 59/122* (2023.02); *H10K 59/38* (2023.02); *H10K 2102/351* (2023.02); *H10W 90/00* (2026.01)

(58) Field of Classification Search
CPC ............. H10K 59/875; H10K 59/8791; H10K 2102/351; H01L 25/105; H01L 33/46; H01L 33/50; G02B 1/111; G02B 1/115; G02B 5/201; C08L 83/16
See application file for complete search history.

(56) References Cited

U.S. PATENT DOCUMENTS

| | | | | |
|---|---|---|---|---|
| 10,088,604 | B2 | 10/2018 | Sakaguchi | |
| 11,587,980 | B2 | 2/2023 | Cho et al. | |
| 2006/0013116 | A1* | 1/2006 | Matsuishi | G11B 7/24094 |
| 2008/0239488 | A1* | 10/2008 | Asakura | G02B 1/111 349/96 |
| 2009/0029151 | A1* | 1/2009 | Noguchi | G06F 3/045 428/327 |
| 2015/0003777 | A1* | 1/2015 | Tseng | H10F 39/8053 438/70 |
| 2015/0007877 | A1* | 1/2015 | Brainard | H10F 19/80 438/72 |
| 2015/0097168 | A1* | 4/2015 | Hanawa | H10K 59/121 257/40 |
| 2016/0264820 | A1 | 9/2016 | Kikuchi et al. | |
| 2017/0090084 | A1* | 3/2017 | Wilson | G02B 5/286 |
| 2018/0074326 | A1 | 3/2018 | Lee et al. | |
| 2019/0113799 | A1 | 4/2019 | Shin et al. | |
| 2019/0265390 | A1* | 8/2019 | Lim | G02F 1/133617 |
| 2021/0257347 | A1* | 8/2021 | Shih | B32B 27/281 |
| 2021/0408495 | A1* | 12/2021 | Gu | H10K 50/86 |
| 2022/0365257 | A1* | 11/2022 | Kim | G02B 5/0242 |

FOREIGN PATENT DOCUMENTS

| | | | | |
|---|---|---|---|---|
| CN | 112310153 | A | 2/2021 | |
| EP | 3293563 | A1 | 3/2018 | |
| JP | 6650055 | B2 | 2/2020 | |
| KR | 1020160060876 | A | 5/2016 | |
| KR | 1020180031897 | A | 3/2018 | |
| KR | 1020190121434 | A | 10/2019 | |
| KR | 1020200078796 | A | 7/2020 | |
| WO | WO-2020130760 | A1 * | 6/2020 | H01L 27/323 |

OTHER PUBLICATIONS

Sun, et al., Interfacial Engineering in Solution Processing of Silicon-Based Hybrid Multilayer for High Performance Thin Film Encapsulation, Applied Materials & Interfaces, 2019, 11, pp. 43425-43432.

* cited by examiner

DM1
PP
CFL
DP
ARL
OC
CF
BM
BFL
CCL
DP-ED
DP-CL
BS
II'
II
NPXA
PXA-R
NPXA
PXA-G
NPXA
PXA-B
NPXA
BR3
SP
QD2
CF-R
CCP-R
BR2
SP
QD1
CF-G
CCP-G
BR1
SP
CF-B
CCP-B
BK
CPL
TFE
EL2
OL
EL1
PDL
ED

DM1
PP-1
CFL-1
DP
ARL
OC
CF-1
BM
BFL
CCL-1
DP-ED
DP-CL
BS
II'
NPXA
PXA-R
QD2
SP
BR3
CF-R
CCP-R1
NPXA
PXA-G
QD1
SP
BR2
CF-G
CCP-G1
NPXA
PXA-B
SP
BR1
CF-B
CCP-B1
NPXA
BK-1
CPL
TFE
EL2
OL
EL1
PDL
ED
II

DISPLAY MODULE AND TILING DISPLAY DEVICE HAVING AN ANTIREFLECTION LAYER

This application claims priority to Korean Patent Application No. 10-2021-0044186, filed on Apr. 5, 2021, and all the benefits accruing therefrom under 35 U.S.C. § 119, the content of which in its entirety is herein incorporated by reference.

BACKGROUND

1. Field

Embodiments of the disclosure relate to a display module and a tiling (or tiled) display device including the display module, and more particularly, relate to a display module with improved durability and visibility, and a tiling display device including the display module.

2. Description of the Related Art

Various types of display devices are used to provide image information. An outer surface of such a display device may be desired to have high surface hardness and impact resistance to protect the display device from an external environment and to have reliability even in repeated use.

In addition, when the display device is exposed to external light such as various lighting and natural light, an image created inside by the reflected light may not be clearly transmitted to a user, or the user may feel eye fatigue or cause a headache. For this reason, demand for antireflection is also increasing.

SUMMARY

Embodiments of the disclosure provide a display module having high surface hardness and antireflection.

Embodiments of the disclosure provide a display device with improved durability and visibility, including a display module having high surface hardness and low reflection characteristics.

According to an embodiment, a display module includes a display panel, an optical layer disposed on the display panel, an antireflection layer disposed on the optical layer, where the antireflection layer includes a first layer including silicon oxynitride, a second layer disposed on the first layer and including silicon nitride, and a third layer disposed on the second layer and including polysilazane.

In an embodiment, a refractive index of the first layer may be about 1.60 or more and about 1.69 or less, a refractive index of the second layer may be about 1.70 or greater and about 1.90 or less, and a refractive index of the third layer may be about 1.35 or greater and about 1.45 or less.

In an embodiment, a thickness of each of the first to third layers may be about 50 nanometers (nm) or greater and about 150 nm or less.

In an embodiment, a reflectance on an upper surface of the antireflection layer may be about 2% or less.

In an embodiment, a surface hardness of an upper surface of the antireflection layer may be 3H or more.

In an embodiment, the display module may further include a light control layer disposed between the display panel and the optical layer.

In an embodiment, the display panel may include a plurality of light-emitting elements which generates a first light, and the light control layer may include a first light control unit which transmits the first light, a second light control unit which converts the first light into a second light having a wavelength different from a wavelength of the first light, and a third light control unit which converts the first light into a third light having a wavelength different from a wavelength of each of the first light and the second light.

In an embodiment, the optical layer may include a color filter layer disposed on the display panel and an overcoat layer disposed on the color filter layer, and the antireflection layer is in contact with an upper surface of the overcoat layer.

In an embodiment, a refractive index of the overcoat layer may be about 1.45 or greater and 1.53 or less, and a thickness of the overcoat layer may be about 3 micrometers (μm) or greater and about 10 μm or less.

In an embodiment, an upper surface of the third layer may define an outermost surface of the antireflection layer.

In an embodiment, the polysilazane may include at least one repeating unit selected from a first repeating unit and a second repeating unit. In such an embodiment, the first repeating unit of the following formula.

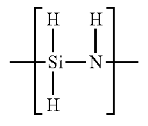

In such an embodiment, the second repeating unit is a unit of the following formula.

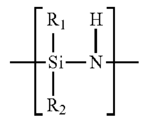

In the first repeating unit and the second repeating unit, each of $R_1$ and $R_2$ is independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 1 or greater to 30 or less carbon atoms, a substituted or unsubstituted alkenyl group having 2 or greater and 30 or less carbon atoms, a substituted or unsubstituted aryl group having 6 or greater and 30 or less ring carbon atoms, or a substituted or unsubstituted heteroaryl group having 2 or greater and 30 or less ring carbon atoms.

In an embodiment, the polysilazane may be represented by one of the following Formulas 1 and 2.

[Formula 1]

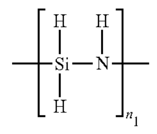

-continued

[Formula 2]

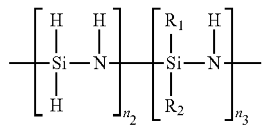

In Formula 1 and Formula 2, each of $R_1$ and $R_2$ is independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 1 or greater to 30 or less carbon atoms, a substituted or unsubstituted alkenyl group having 2 or greater and 30 or less carbon atoms, a substituted or unsubstituted aryl group having 6 or more and 30 or less ring carbon atoms, or a substituted or unsubstituted heteroaryl group having 2 or greater and 30 or less ring carbon atoms, and each of $n_1$, $n_2$, and $n_3$ is independently an integer of 10 or greater and 10,000 or less.

In an embodiment, a tolerance between a surface of the antireflection layer and a side surface of the display panel may be about 30 μm or less.

In an embodiment, the first layer may be in contact with an upper surface of the optical layer, the second layer may be in contact with an upper surface of the first layer, and the third layer may be in contact with an upper surface of the second layer.

According to an embodiment, a display module includes a display panel, an optical layer disposed on the display panel, and an antireflection layer disposed on the optical layer, and the optical layer includes a color filter layer including a plurality of color filter units and an overcoat layer disposed on the color filter layer, and the antireflection layer includes a first layer disposed on the overcoat layer, a second layer disposed on the first layer, and a third layer disposed on the second layer and including polysilazane.

According to an embodiment, a tiling display device includes a plurality of display modules arranged in at least one direction, where each of the plurality of display modules includes a display panel, an optical layer disposed on the display panel, and an antireflection layer disposed on the optical layer, and the antireflection layer includes a first layer including silicon oxynitride, a second layer disposed on the first layer and including silicon nitride, and a third layer disposed on the second layer and including polysilazane.

BRIEF DESCRIPTION OF THE DRAWINGS

The above and other features of the disclosure will become apparent by describing in detail embodiments thereof with reference to the accompanying drawings, in which.

DETAILED DESCRIPTION

Figure 1A:
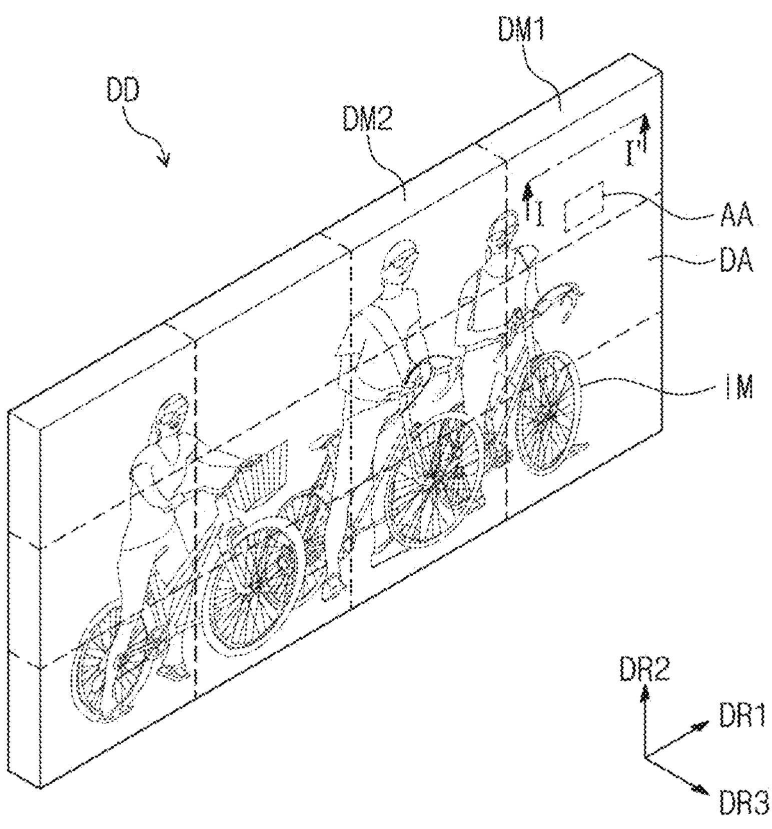
FIG. 1A is a perspective view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations of the associated listed items.

The terms "first", "second", and the like are used to describe various components, but the components are not limited by the terms. The terms are used only to differentiate one component from another component. For example, a first component may be named as a second component, and vice versa, without departing from the spirit or scope of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that the terms “include”, “comprise”, “have”, etc. specify the presence of features, numbers, steps, operations, elements, or components, described in the specification, or a combination thereof, not precluding the presence or additional possibility of one or more other features, numbers, steps, operations, elements, or components or a combination thereof.

It will be understood that “directly disposed” may mean that there is no layer, film, region, plate, etc. added between a portion such as a layer, a film, a region, or a plate and another portion. For example, “directly disposed” may mean disposing layers without using an additional member such as an adhesive member between two layers or between two members.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device according to the disclosure and a display module included therein will be described in detail with reference to the accompanying drawings.

Figure 1B:
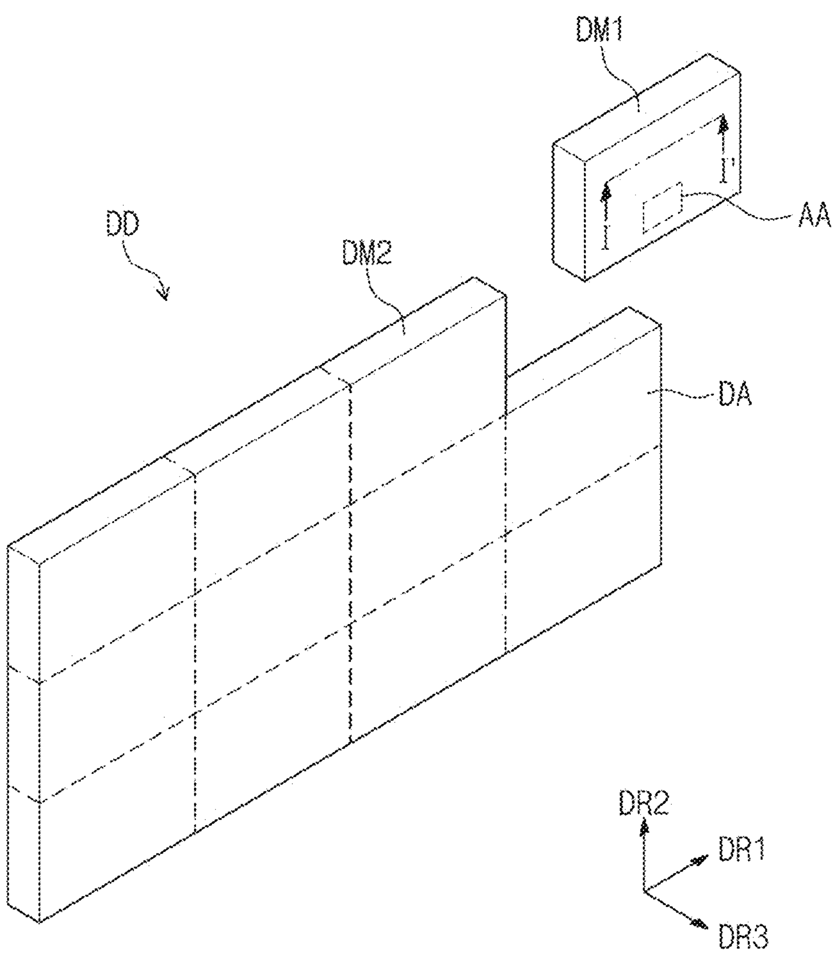
FIG. 1B is a perspective view illustrating a display device with a partial configuration exploded according to an embodiment.

FIG. 1A is a perspective view illustrating a display device according to an embodiment of the disclosure. FIG. 1B is a perspective view illustrating a display device with a partial configuration exploded according to an embodiment.

A display device DD may be a device that is activated in response to an electrical signal. In embodiments, the display device DD may be a large electronic device such as a television, a monitor, or an external billboard, for example. In an embodiment, the display device DD may be a tiling (or tiled) display including a plurality of display modules DM1 and DM2. However, the disclosure is not limited thereto, and the display device DD may be a display device including only a single display module DM1. Each of the display modules DM1 and DM2 included in the display device DD may be applicable to a tiling display device because a tolerance between a display panel and other components is reduced. Also, although one of the display modules DM1 and DM2 is applied to the display device DD alone, a bezel of the display device DD may be reduced, thereby improving aesthetics of the display device. Hereinafter, a detailed configuration of the display modules DM1 and DM2 will be described later. A description of a display module according to an embodiment to be described later may be equally applied to the plurality of display modules DM1 and DM2, respectively.

In an embodiment of the display device DD, the plurality of display modules DM1 and DM2 may be arranged side by side on a plane. The plurality of display modules DM1 and DM2 may be arranged in parallel in a first direction DR1 and a second direction DR2 crossing the first direction DR1. One edge of the plurality of display modules DM1 and DM2 may be in contact with each other. in such an embodiment, the display device DD may be a device in which a plurality of individually provided display modules DM1 and DM2 are combined with each other to display one image IM.

The display device DD may include a display area in which the image IM is displayed. The display area in which the image IM is displayed may be parallel to a plane defined by the first direction DR1 and the second direction DR2. In an embodiment, the display device DD may include a display area DA and may not include a non-display area.

The display device DD may have a three-dimensional shape with a specific thickness in a third direction DR3 that is a direction perpendicular to a plane defined by the first direction DR1 and the second direction DR2 crossing the first direction DR1. Herein, an upper surface (or front surface) and a lower surface (or rear surface) of each member are defined based on a direction in which an image is displayed in the display area DA. The upper and lower surfaces may be opposite to each other based on the third direction DR3, and a normal direction of each of the upper and lower surfaces may be parallel to the third direction DR3. Herein, the directions indicated by the first to third directions DR1, DR2, and DR3 which are relative concepts may be converted to other directions.

Figure 2A:
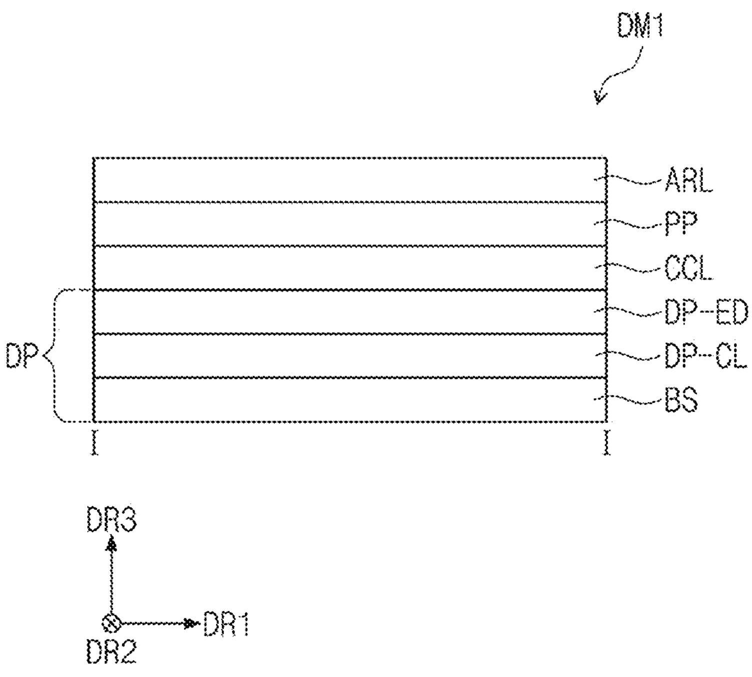
FIGS. 2A and 2B are cross-sectional views of a display module according to an embodiment.
Figure 2B:
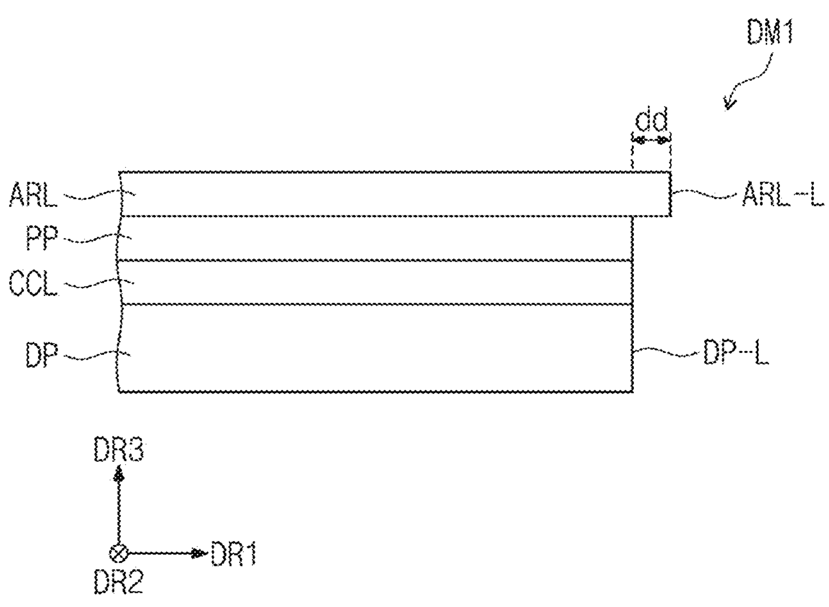

FIGS. 2A and 2B are cross-sectional views of a display module according to an embodiment. FIG. 2A is a cross-sectional view taken along line I-I' of FIG. 1. FIG. 2B is a cross-sectional view illustrating a portion adjacent to one side of a display module according to an embodiment.

Referring to FIG. 2A, an embodiment of the display module DM1 includes an antireflection layer ARL and a display panel DP. The antireflection layer ARL may be disposed on the display panel DP. An optical layer PP and a light control layer CCL may be disposed between the antireflection layer ARL and the display panel DP. The antireflection layer ARL may be directly disposed on the optical layer PP. In such an embodiment, the antireflection layer ARL may not be attached to the optical layer PP in a form of a separate film with a sticky layer or an adhesive layer therebetween, but may be a layer directly formed on the optical layer PP through deposition.

The display panel DP may be activated in response to an electrical signal. In such an embodiment, the display panel DP may be activated to display the image IM on the display area DA of the display device DD, and the user may receive information through the image IM, for example. In an embodiment, the display panel DP may be activated to sense an external input applied to the upper surface. The external input may include a user’s touch, contact or proximity of a lifeless-object, pressure, light, or heat, and is not limited thereto.

The display panel DP may be a light-emitting display panel. For example, the display panel DP may be a light-emitting diode ("LED") display panel, an organic electroluminescence display panel, or a quantum-dot emission display panel. However, the embodiment is not limited thereto. The display panel DP may provide first light. In one embodiment, for example, the display panel DP may emit blue light.

The LED display panel includes a light-emitting diode, an emission layer of the organic electroluminescence display panel includes an organic electroluminescent material, and an emission layer of the quantum-dot emission display panel includes a quantum-dot or a quantum rod. Hereinafter, for convenience of description, embodiments where the display panel DP included in the display module DM1 is an organic electroluminescence display panel will be described in detail. However, the embodiment is not limited thereto.

In an embodiment, the display panel DP may include a base layer BS, a circuit layer DP-CL disposed on the base layer BS, and a display element layer DP-ED disposed on the circuit layer DP-CL.

The base layer BS may have a structure in which an organic insulating layer including an organic material and an inorganic insulating layer including an inorganic material are alternately stacked one on another. In such an embodiment, the base layer BS may be flexible. However, the disclosure is not limited thereto, and alternatively, the base layer BS may be rigid or may be provided as a single layer, but the base layer BS is not limited thereto.

The circuit layer DP-CL may be disposed on the base layer BS and may include a plurality of transistors. The circuit layer DP-CL may include a driving transistor and a switching transistor for driving a light-emitting element ED (see FIG. 4A) of the display element layer DP-ED. In an embodiment, the circuit layer DP-CL may include a plurality of insulating layers.

The display element layer DP-ED may be disposed on the circuit layer DP-CL and may be electrically connected to the circuit layer DP-CL to receive a signal. The display element layer DP-ED may include a plurality of light-emitting elements ED (see FIG. 4A). A type of the light-emitting element is, for example, an organic light-emitting element, a quantum-dot light-emitting element, a liquid crystal capacitor, an electrophoretic element, or an electrowetting element, but not being limited thereto.

In an embodiment, the display module DM1 may further include the optical layer PP disposed on the display panel DP. In an embodiment, the display module DM1 may further include a light control layer CCL disposed between the optical layer PP and the display panel DP.

The light control layer CCL may be a layer that selectively converts a wavelength of light generated in the display element layer DP-ED or transmits the light. The light control layer CCL may control a wavelength of light and include a plurality of light control units including a light emitter such as a quantum-dot. The optical layer PP may be a layer disposed on the display panel DP to control reflected light from the display panel DP by external light and to increase color purity of light emitted to the outside. In one embodiment, for example, the optical layer PP may include a polarizing layer and/or a color filter layer. Alternatively, unlike in the drawings, the light control layer CCL may be omitted in the display module DM1.

Referring to FIG. 2B, in an embodiment of the display module DM1, a specific tolerance dd between a side surface ARL-L of the antireflection layer ARL and a side surface DP-L of the display panel DP may be defined. In such an embodiment of the display module DM1, the side surface ARL-L of the antireflection layer ARL and the side surface DP-L of the display panel DP may not be aligned, and one of the side surface ARL-L of the antireflection layer ARL and the side surface DP-L of the display panel DP may protrude from the other in the first direction DR1 or the second direction DR2. The tolerance dd may be formed when the antireflection layer ARL and the display panel DP are etched in a same process during the manufacturing process of the display module DM1. The tolerance dd may be formed due to a difference in etch rates between the antireflection layer ARL and the display panel DP in the same etching process of the antireflection layer ARL and the display panel DP.

FIG. 2B illustrates an embodiment where the side surface ARL-L of the antireflection layer ARL protrudes from the side surface DP-L of the display panel DP, but is not limited thereto, and alternatively, the side surface DP-L of the display panel DP may protrude from the side surface ARL-L of the antireflection layer ARL. In an embodiment, as shown in FIG. 2B, each side surface of the optical layer PP and the light control layer CCL may be aligned with the side surface DP-L of the display panel DP, but is not limited thereto, and alternatively, one of the side surfaces of the optical layer PP and the light control layer CCL may not be aligned with the side surface DP-L of the display panel DP.

In an embodiment of the display module DM1, the tolerance dd defined between the side surface ARL-L of the antireflection layer ARL and the side surface DP-L of the display panel DP may be about 30 micrometers (μm) or less. In an embodiment of the display module DM1, the antireflection layer ARL may not be provided in a form of a separate film, but may be a layer directly formed by being deposited on a configuration such as the optical layer PP, and thus the tolerance dd defined between the side surface ARL-L of the antireflection layer ARL and the side surface DP-L of the display panel DP may be about 30 μm or less. If the tolerance dd defined between the side surface ARL-L of the antireflection layer ARL and the side surface DP-L of the display panel DP is greater than 30 μm, the display module DM1 may not be applied to the tiling display device due to the large tolerance. In an embodiment of the tiling display device, a plurality of display modules may be in contact and combine with one another to display a single image, and thus when the tolerance dd defined between the side surface ARL-L of the antireflection layer ARL and the side surface DP-L of the display panel DP is greater than about 30 μm, the tiling display device that displays one image may not be implemented as a distance between the display areas of each of the adjacent display modules increases.

Figure 3:
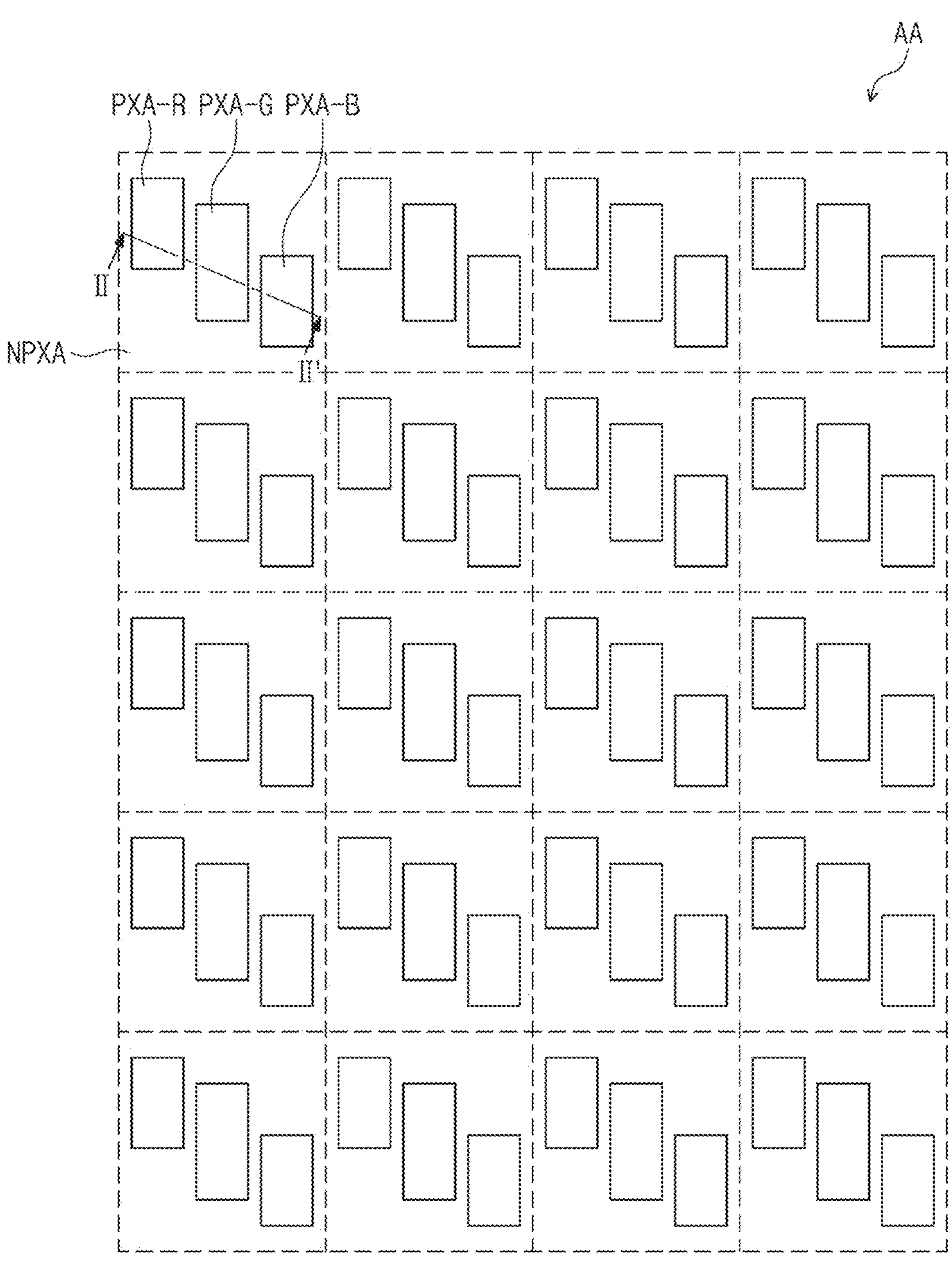
FIG. 3 is an enlarged plan view illustrating a part of a display module according to an embodiment.
Figure 4A:
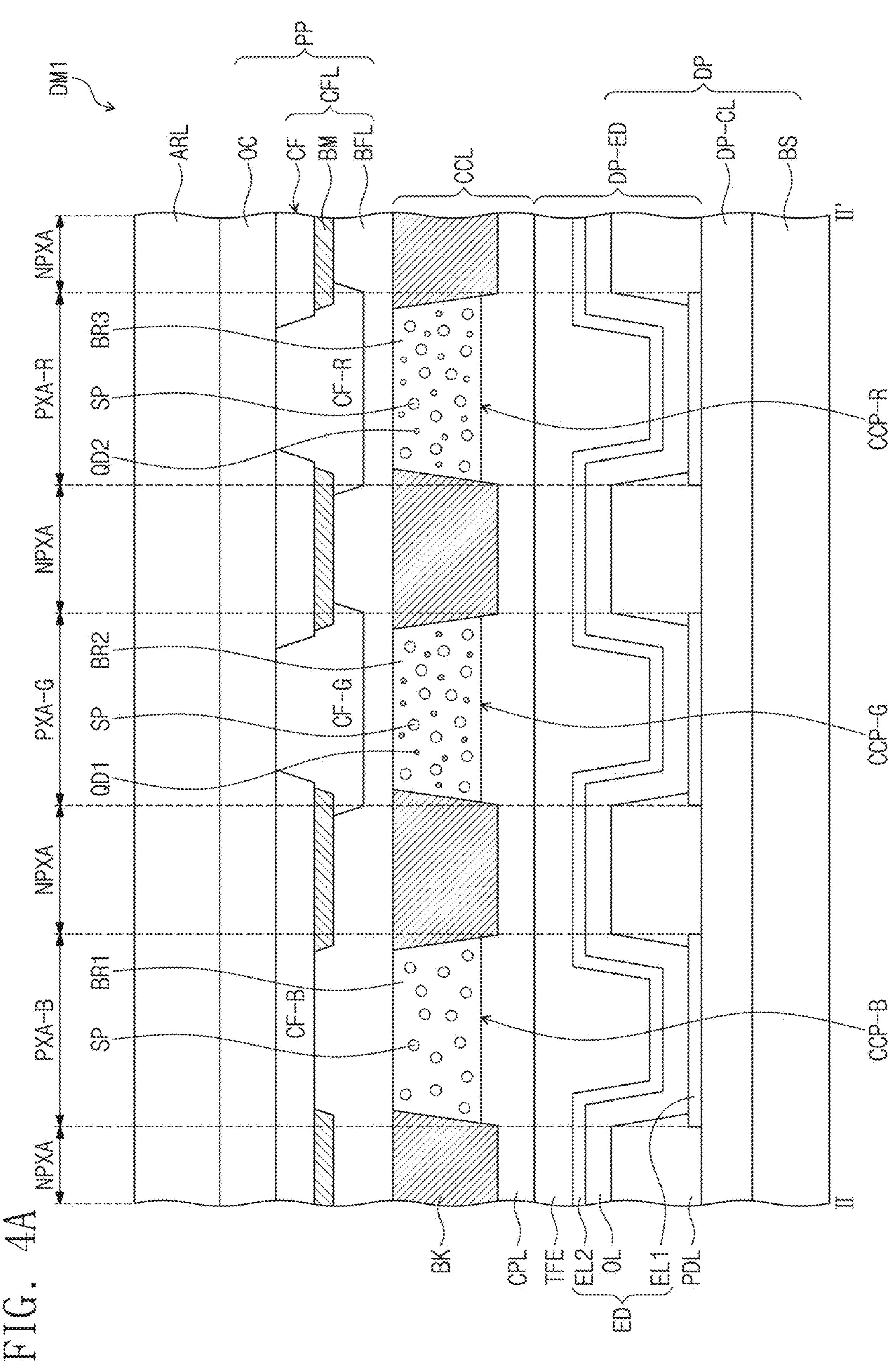
FIGS. 4A and 4B are cross-sectional views of a display module according to an embodiment.
Figure 4B:
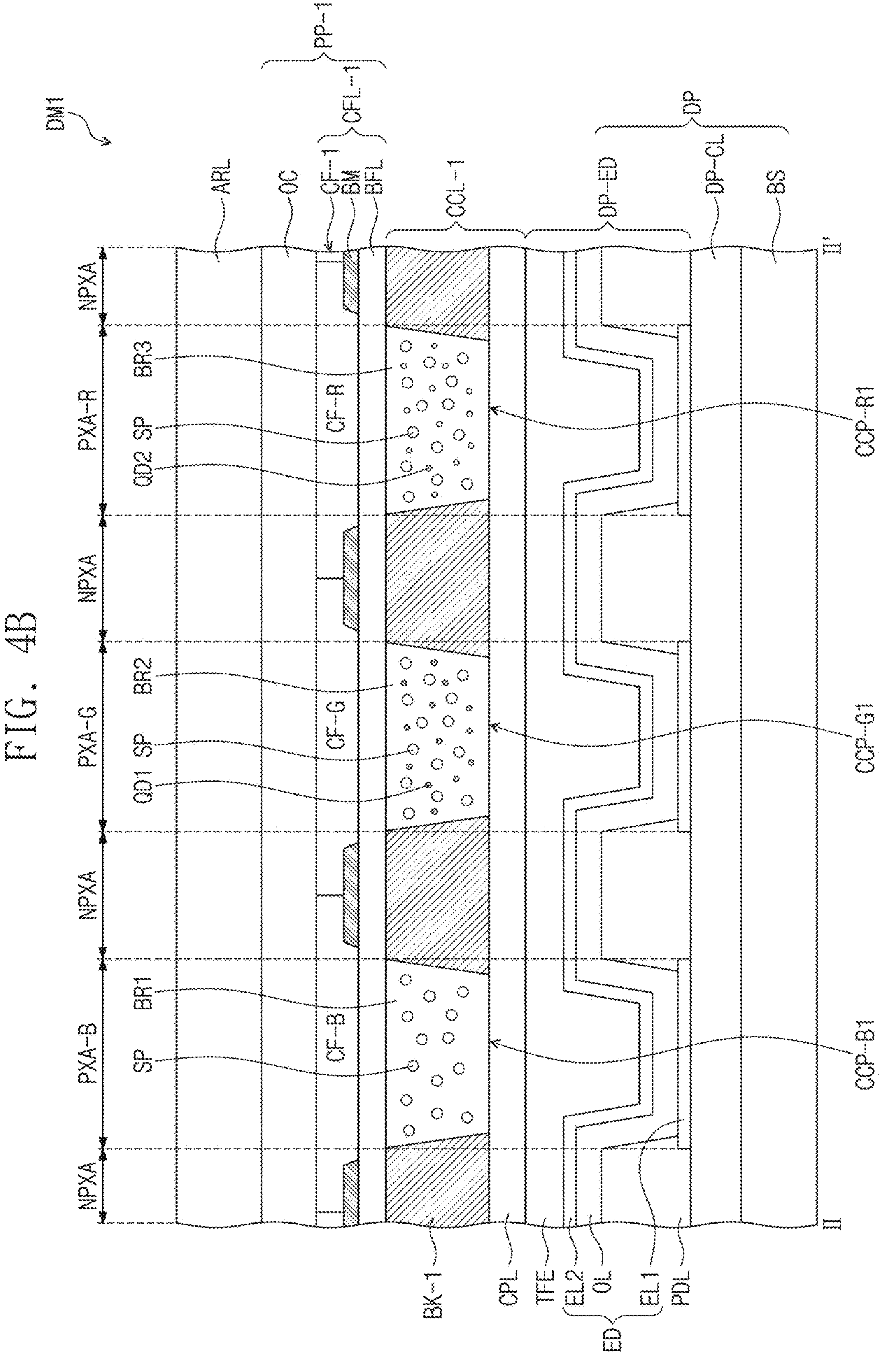

FIG. 3 is an enlarged plan view illustrating a part of a display module according to an embodiment. FIGS. 4A and 4B are cross-sectional views of a display module according to an embodiment. More particularly, FIG. 3 is an enlarged view of an area corresponding to AA area shown in FIGS. 1A and 1B. FIGS. 4A and 4B are cross-sectional views taken along line II-II' of FIG. 3.

Referring to FIGS. 3, 4A, and 4B, an embodiment of the display module DM1 may include a non-emission area NPXA and emission areas PXA-B, PXA-G, and PXA-R. Each of the emission areas PXA-B, PXA-G, and PXA-R may be a region in which light generated by the light-emitting element ED is emitted. The emission areas PXA-B, PXA-G, and PXA-R may be spaced from one another on a plane. In an embodiment, as shown in FIG. 3, the areas of the emission areas PXA-R, PXA-B, and PXA-G are the same as each other, but is not limited thereto and alternatively, the areas of the emission areas PXA-R, PXA-B, and PXA-G may be different from one another. Here, the area may mean the area when viewed on a plane or from a top plan view.

The emission areas PXA-R, PXA-B, and PXA-G may be divided into a plurality of groups depending on a color of the emitted light. FIGS. 3, 4A and 4B illustrate an embodiment where three emission areas PXA-R, PXA-B, and PXA-G emit red light, blue light, and green light in the display module DM1. In one embodiment, for example, the display module DM1 may include a red emission area PXA-R, a blue emission area PXA-B, and a green emission area PXA-G that are separated from one another.

In an embodiment, the emission areas PXA-B, PXA-G, and PXA-R may have a stripe structure in which the blue emission area PXA-B, and the green emission area PXA-G, and the red emission area PXA-R are sequentially alternately arranged in the first direction DR1. FIG. 3 illustrates that each of the blue emission area PXA-B, the green emission area PXA-G, and the red emission area PXA-R has the same area, but are not limited thereto, and some of the blue emission area PXA-B, the green emission area PXA-G, and the red emission area PXA-R may have different areas. In one embodiment, for example, the area of the green emission area PXA-G may be larger than those of the blue emission area PXA-B and the red emission area PXA-R, and the area of the blue emission area PXA-B and the area of the emission area PXA-R may be the same as each other. Herein, "the area" may mean the area when viewed on a plane defined by the first direction DR1 and the second direction DR2. FIG. 3 illustrates that each of the blue emission area PXA-B, the green emission area PXA-G, and the red emission area PXA-R has a rectangular shape, but is not limited thereto. The emission areas PXA-R, PXA-B, and PXA-G may have various polygonal shapes or circular shapes. In addition, an arrangement structure of the emission areas is not limited to the stripe structure, and may be, for example, a pentile structure.

Referring to FIG. 4A, an embodiment of the display module DM1 may include the light control layer CCL disposed on the display panel DP. In such an embodiment, the display module DM1 may include the optical layer PP. The optical layer PP may include a color filter layer CFL disposed on the light control layer CCL and an overcoat layer OC disposed on the color filter layer CFL.

The display panel DP may be a light-emitting display panel. In one embodiment, for example, the display panel DP may be an organic electroluminescence display panel or a quantum-dot emission display panel.

The display panel DP may include the base layer BS, the circuit layer DP-CL and the display element layer DP-ED which are provided on the base layer BS. The display element layer DP-ED may include a pixel defining layer PDL, a light-emitting element ED disposed between the pixel defining layers PDL, and an encapsulation layer TFE disposed on the light-emitting element ED.

The pixel defining layer PDL may include or be formed of a polymer resin. In one embodiment, for example, the pixel defining layer PDL may include or be formed of a polyacrylate-based resin or a polyimide-based resin. In an embodiment, the pixel defining layer PDL may include or be formed of a light absorbing material, or may further include a black pigment or a black dye. In an embodiment, the pixel defining layer PDL may include or be formed of an inorganic material. In one embodiment, for example, the pixel defining layer PDL may include or be formed of silicon nitride (SiNx), silicon oxide (SiOx), silicon oxynitride (SiOxNy), or the like. The pixel defining layer PDL may define the emission areas PXA-R, PXA-B, and PXA-G. The emission areas PXA-R, PXA-B, and PXA-G and the non-emission area NPXA may be divided by the pixel defining layer PDL.

The display element layer DP-ED may include the light-emitting element ED, and the light-emitting element ED may include a first electrode EL1 and a second electrode EL2 which face each other, and a plurality of layers OL disposed between the first electrode EL1 and the second electrode EL2. The plurality of layers OL may include a hole transport region, an emission layer, and an electron transport region. The hole transport region may include a hole injection layer adjacent to the first electrode EL1 and a hole transport layer disposed between the hole injection layer and the emission layer. The electron transport region may include an electron injection layer adjacent to the second electrode EL2 and an electron transport layer disposed between the emission layer and the electron injection layer. In an embodiment, the light-emitting element ED may provide a first light. The first light may be light having an emission wavelength of about 410 nanometers (nm) or greater and about 480 nm or less, that is, in a range of about 410 nm to about 480 nm. In one embodiment, for example, the light-emitting element ED may emit blue light.

In an embodiment, the light-emitting element ED may include a plurality of light-emitting structures sequentially disposed between the first electrode EL1 and the second electrode EL2. In such an embodiment, the light-emitting element ED may be a tandem light-emitting element. Each of the plurality of light-emitting structures may include an emission layer, and a hole transport region and an electron transport region disposed with the emission layer therebetween. A charge generation layer may be disposed between the plurality of light-emitting structures. In one embodiment, for example, three light-emitting structures including an emission layer that emits blue light may be provided, and one light-emitting structure including an emission layer that emits green light may be provided. However, the disclosure is not limited thereto, and the arrangement order between the light-emitting structures or the number of light-emitting structures may be variously changed or modified.

The encapsulation layer TFE may be disposed on the light-emitting element ED, and the encapsulation layer TFE may be disposed on the second electrode EL2. The encapsulation layer TFE may be directly disposed on the second electrode EL2. The encapsulation layer TFE may be a single layer or a stack of a plurality of layers.

The light control layer CCL may be disposed on the display panel DP with a capping layer CPL interposed therebetween. The light control layer CCL may include a plurality of partition walls BK disposed to be spaced from each other, and light control units CCP-B, CCP-G, and CCP-R disposed between the partition walls BK. The partition wall BK may include a polymer resin and a liquid repellent additive. The partition wall BK may include a light absorbing material, or may include a pigment or a dye. In one embodiment, for example, the partition wall BK may include a black pigment or a black dye to implement a black partition wall. In an embodiment, in a process of forming the black partition wall, carbon black or the like may be used as a black pigment or a black dye, but embodiments are not limited thereto.

The light control layer CCL may include a first light control unit CCP-B for transmitting the first light, a second light control unit CCP-G for converting the first light into a second light, and a third light control unit CCP-R for converting the first light into a third light. The second light may be light in a longer wavelength region than the first light, and the third light may be light in a longer wavelength region than the first light and the second light. In one embodiment, for example, the first light may be light with an emission wavelength of about 410 nm or greater and about 480 nm or less, the second light may be light with an emission wavelength of about 500 nm or greater and about 600 nm or less, and the third light may be light with an emission wavelength of about 620 nm or greater and about 700 nm or less. In an embodiment, the first light may be blue light, the second light may be green light, and the third light may be red light.

Each of the second light control unit CCP-G and the third light control unit CCP-R may include a light emitter. The light emitter may be a particle that emits light of a different wavelength by converting a wavelength of incident light. In an embodiment, the light emitter included in the second light control unit CCP-G and the third light control unit CCP-R may be a quantum-dot or a phosphor. The second light control unit CCP-G may include a first quantum-dot QD1 that converts the first light into the second light, and the third light control unit CCP-R may include a second quantum-dot QD2 that converts the first light into the third light. The first light control unit CCP-B may be a transmissive unit that transmits the first light without converting the wavelength, and may not include a separate light emitter. However, the disclosure is not limited thereto, and first light control unit CCP-B may include a light emitter such as a quantum-dot for converting light incident on the first light control unit CCP-B into first light.

The quantum-dot may be a particle that converts the wavelength of light incident thereon. A core of the quantum-dot may include at least one selected from a group II-VI compound, a group III-V compound, a group IV-VI compound, a group IV element, a group IV compound, and combinations thereof.

The group II-VI compound may include at least one selected from a binary compound such as CdSe, CdTe, CdS, ZnS, ZnSe, ZnTe, ZnO, HgS, HgSe, HgTe, MgSe, MgS, and mixtures thereof, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, MgZnTe, HgZnS, MgZnTe, and mixtures thereof, and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include a binary compound such as $In_2S_3$, $In_2Se_3$, or a ternary compound such as $InGaS_3$, $InGaSe_3$, or any combination thereof.

The group I-III-VI compound may include at least one selected from a ternary compound such as AgInS, $AgInS_2$, CuInS, $CuInS_2$, $AgGaS_2$, $CuGaS_2$, $CuGaO_2$, $AgGaO_2$, $AgAlO_2$, and mixtures thereof, or a quaternary compound such as $AgInGaS_2$ and $CuInGaS_2$.

The group III-V compound may include at least one selected from a binary compound such as GaN, GaP, GaAs, GaSb, AlN, AlP, AlAs, AlSb, InN, InP, InAs, InSb and mixtures thereof, a ternary compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. In one embodiment, for example, InZnP or the like may be selected as the group III-II-V compound.

The group IV-VI compound may include at least one selected from a binary compound such as SnS, SnSe, SnTe, PbS, PbSe, PbTe, and mixtures thereof, a ternary compound such as SnSeS, SnSeTe, SnSTe, PbSeS, PbSeTe, PbSTe, SnPbS, SnPbSe, SnPbTe, and mixtures thereof, and a quaternary such as SnPbSSe, SnPbSeTe, SnPbSTe, and a mixture thereof. The group IV element may include at least one selected from Si, Ge, and mixtures thereof. The group IV compound may include at least one selected from a binary compound such as SiC, SiGe, and mixtures thereof.

Here, the binary compound, the ternary compound, or the quaternary compound in a particle may have a uniform concentration, respectively, or may have a different concentration distribution from one another. In addition, one quantum-dot may have a core-shell structure surrounding another quantum-dot. An interface between the core and the shell may have a concentration gradient in which the concentration of elements in the shell decreases toward the core.

In an embodiment, the quantum-dot may have a core-shell structure including a core including at least one selected from the above-described nanocrystals and a shell surrounding the core. The shell of the quantum-dot may serve as a protective layer for maintaining semiconductor properties by preventing chemical modification of the core and/or a charging layer for imparting electrophoretic properties to the quantum-dots. The shell may be a single layer or multiple layers. The interface between the core and the shell may have a concentration gradient in which the concentration of elements in the shell decreases toward the core. In an embodiment, the shell of the quantum-dot include metal oxide or non-metal oxide, a semiconductor compound, or combinations thereof.

In an embodiment, the metal oxide or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, NiO, or a ternary compound such as $MgAl_2O_4$, $CoFe_2O_4$, $NiFe_2O_4$, and $CoMn_2O_4$, but the disclosure is not limited thereto.

In an embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the disclosure is not limited thereto.

The quantum-dot may have a full width of half maximum ("FWHM") of an emission wavelength spectrum of about 45 nm or less, for example, of about 40 nm or less, or of about 30 nm or less, and color purity or color reproducibility may be improved in the above range. In addition, the light emitted through the quantum-dots may be emitted in all directions, thereby improving a wide viewing angle.

In an embodiment, a shape of the quantum-dot is a form generally used in the art, but not particularly limited. In such an embodiment, spherical, pyramidal, multi-arm, or cubic nanoparticles, nanotubes, nanowires, nanofibers, nanoplatelet particles, and the like may be used as the quantum-dot.

The quantum-dot may control a color of light emitted depending on a particle size, and accordingly, the quantum-dot may have various emission colors such as blue, red, and green.

The quantum-dot may control the color of light emitted depending on the particle size thereof, and accordingly, the quantum-dot may have various emission colors such as blue, red, and green. As the particle size of the quantum-dot is smaller, the quantum-dot may be to emit light in a short wavelength region. In one embodiment, for example, the particle size of the quantum-dot emitting green light may be smaller than the particle size of the quantum-dot emitting red light, and the particle size of the quantum-dot emitting blue light may be smaller than the particle size of the quantum-dot emitting green light.

Each of the plurality of light control units CCP-B, CCP-G, and CCP-R included in the light control layer CCL may further include a scatterer SP. The first light control unit CCP-B may include only a scatterer SP, the second light control unit CCP-G may include a first quantum-dot QD1 and a scatterer SP, and the third light control unit CCP-R may include a second quantum-dot QD2 and a scatterer SP.

The scatterer SP may be an inorganic particle. In one embodiment, for example, the scatterer SP may include at least one selected from $TiO_2$, ZnO, $Al_2O_3$, $SiO_2$, and hollow silica. The scatterer SP may include one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first light control unit CCP-B, the second light control unit CCP-G, and the third light control unit CCP-R may include base resins BR1, BR2, and BR3 that disperse the quantum-dots QD1 and QD2 and the scatterer SP. In an embodiment, the first light control unit CCP-B may include the scatterer SP dispersed in the first base resin BR1, the second light control unit CCP-G may include the first quantum-dot QD1 and the scatterer SP dispersed in the second base resin BR2, and the third light control unit CCP-R may include the second quantum-dot QD2 and the scatterer SP dispersed in the third base resin BR3. The base resins BR1, BR2, and BR3, which are a medium in which the quantum-dots QD1 and QD2 and the scatterer SP are dispersed may include or be made of various resin compositions that are generally referred to as binders. In one embodiment, for example, the base resins BR1, BR2, and BR3 may include at least one selected from acrylic resins, urethane resins, silicone resins, epoxy resins, and the like. The base resins BR1, BR2, and BR3 may be transparent resins. In an embodiment, each of the first base resin BR1, the second base resin BR2, and the third base resin BR3 may be the same or different from one another.

The light control layer CCL may further include the capping layer CPL. The capping layer CPL may be disposed on the light control units CCP-B, CCP-G, and CCP-R and the partition wall BK. The capping layer CPL may serve to prevent penetration of moisture and/or oxygen (hereinafter, referred to as "moisture/oxygen"). The capping layer CPL may be disposed on the light control units CCP-B, CCP-G, and CCP-R to block exposure of the light control units CCP-B, CCP-G, and CCP-R to the moisture/oxygen. The capping layer CPL may include at least one inorganic layer.

In an embodiment of the display module DM1, the optical layer PP may include the overcoat layer OC and the color filter layer CFL.

The color filter layer CFL may include a light blocking unit BM and a color filter unit CF. The color filter unit CF may include a plurality of filters CF-B, CF-G, and CF-R. In an embodiment, the color filter layer CFL may include the first filter CF-B that transmits the first light, the second filter CF-G that transmits the second light, and the third filter CF-R that transmits the third light. In one embodiment, for example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or dye. The first filter CF-B may include a blue pigment or dye, the second filter CF-G may include a green pigment or dye, and the third filter CF-R may include a red pigment or dye.

Alternatively, the first filter CF-B may not include a pigment or dye. The first filter CF-B may include a polymer photosensitive resin and may not contain a pigment or dye. The first filter CF-B may be transparent. The first filter CF-B may be formed of a transparent photosensitive resin.

The light blocking unit BM may be a black matrix. The light blocking unit BM may include an organic light blocking material or an inorganic light blocking material including a black pigment or a black dye. The light blocking unit BM may prevent light leakage and may divide a boundary between adjacent filters CF-B, CF-G, and CF-R. Alternatively, the light blocking unit BM may be omitted. Alternatively, the light blocking unit BM may be formed by stacking at least one layer of the filters CF-B, CF-G, and CF-R. In one embodiment, for example, the light blocking unit BM may be formed by stacking all of the first filter CF-B, the second filter CF-G, and the third filter CF-R. In an embodiment where the light blocking unit BM is formed of the first filter CF-B, the second filter CF-G, and the third filter CF-R, a stacking order of the first filter CF-B and the second filter CF-G, and the third filter CF-R is not limited.

The color filter layer CFL may further include a buffer layer BFL. In one embodiment, for example, the buffer layer BFL may be a protective layer protecting the filters CF-B, CF-G, and CF-R. The buffer layer BFL may be an inorganic material layer including at least one selected from silicon nitride, silicon oxide, and silicon oxynitride. The buffer layer BFL may be a single layer or a plurality of layers.

In an embodiment, as shown in FIG. 4A, the first filter CF-B of the color filter layer CFL overlaps the second filter CF-G and the third filter CF-R, but the embodiment is not limited thereto. In one embodiment, for example, the first to third filters CF-B, CF-G, and CF-R may be divided by the light blocking unit BM and may be non-overlapping with one another. In an embodiment, each of the first to third filters CF-B, CF-G, and CF-R may be disposed corresponding to the blue emission area PXA-B, the green emission area PXA-G, and the red emission area PXA-R, respectively.

Although not shown, in an embodiment, a polarizing layer (not shown) may be further included in the optical layer PP of the display module DM1. The polarizing layer may block external light provided from the outside to the display panel DP. The polarizing layer may block some of the external light. In such an embodiment where the display module DM1 includes the polarizing layer, the color filter layer CFL may be omitted.

In an embodiment, the polarizing layer may reduce reflected light from the display panel DP due to external light. In one embodiment, for example, the polarizing layer may function to block reflected light when light provided from the outside of the display module DM1 enters the display panel DP and exits again. The polarizing layer may be a circular polarizer having an antireflection function, or the polarizing layer may include a linear polarizer and a $\lambda/4$ phase retarder. In an embodiment, the polarizing layer may be disposed on the overcoat layer OC to be exposed, or the polarizing layer may be disposed under the overcoat layer OC.

Although not shown, in an embodiment, an upper base layer for providing a reference plane may be disposed on the color filter layer CFL. The upper base layer may be a member that provides a base surface on which the optical layer PP and the light control layer CCL are disposed. The upper base layer may be a glass substrate, a metal substrate, a plastic substrate, or the like. However, embodiments are not limited thereto, and the upper base layer may be an inorganic layer, an organic layer, or a composite material layer. Alternatively, the upper base layer may be omitted.

The overcoat layer OC may be disposed on the color filter layer CFL. The overcoat layer OC may include an organic layer. The overcoat layer OC may include an organic material having high hardness and high planarization characteristics. The overcoat layer OC may provide a flat top surface.

The antireflection layer ARL is disposed on the overcoat layer OC. The antireflection layer ARL may be in contact with an upper surface of the overcoat layer OC. The antireflection layer ARL may be a layer having a low reflectivity to block external light. The antireflection layer ARL may be a layer that has a plurality of layers having different refractive indices from each other and effectively blocks external light through destructive interference. A reflectance on the upper surface of the antireflection layer ARL may be about 2% or less. In the visible light range of 430 nm or greater and about 780 nm or less, the reflectance of the upper surface of the antireflection layer ARL may be about 2% or less.

Referring to FIG. 4B, an embodiment of a display module DM-1 may include a display panel DP, and a light control layer CCL-1 and an optical layer PP-1, which are disposed on the display panel DP. In an embodiment of the display module DM-1, the light control layer CCL-1 may be disposed on the display panel DP. The light control layer CCL-1 may be disposed on the display panel DP with a capping layer CPL interposed therebetween. The light control layer CCL-1 may include a plurality of partition walls BK-1 and light control units CCP-B, CCP-G, and CCP-R disposed between the partition walls BK-1. The optical layer PP-1 may include a color filter layer CFL-1 and an overcoat layer OC. The color filter layer CFL-1 may include a color filter unit CF-1 including a plurality of filters CF-B, CF-G, and CF-R, a light blocking unit BM, and a buffer layer BFL.

In an embodiment of the display module DM-1, as illustrated in FIG. 4B, the light control layer CCL-1 and the color filter layer CFL-1 are disposed on an upper surface of an encapsulation layer TFE as a base surface. In such an embodiment, the light control units CCP-R1, CCP-B1, and CCP-G1 of the light control layer CCL-1 may be formed in a continuous process on the display panel DP, and the filters CF-R1, CF-B1, and CF-G1 of the color filter layer CFL-1 may be sequentially formed on the light control layer CCL-1 through a continuous process. The light control layer CCL-1 may be formed using an upper surface of a capping layer CPL disposed on the display panel DP as a base surface, thereby having a vertically inverted shape with respect to the shape of the light control layer CCL as illustrated in FIG. 4A. In such an embodiment, each of the plurality of partition walls BK-1 and the plurality of light control units CCP-B1, CCP-G1, and CCP-R1 may have a shape that is vertically inverted from that shown in FIG. 4A. The color filter layer CFL-1 may be formed with the upper surface of the light control layer CCL-1 as a base surface, and a shape of each of the light blocking unit BM and the color filter unit CF-1 may be different from that shown in FIG. 4A.

Figure 5:
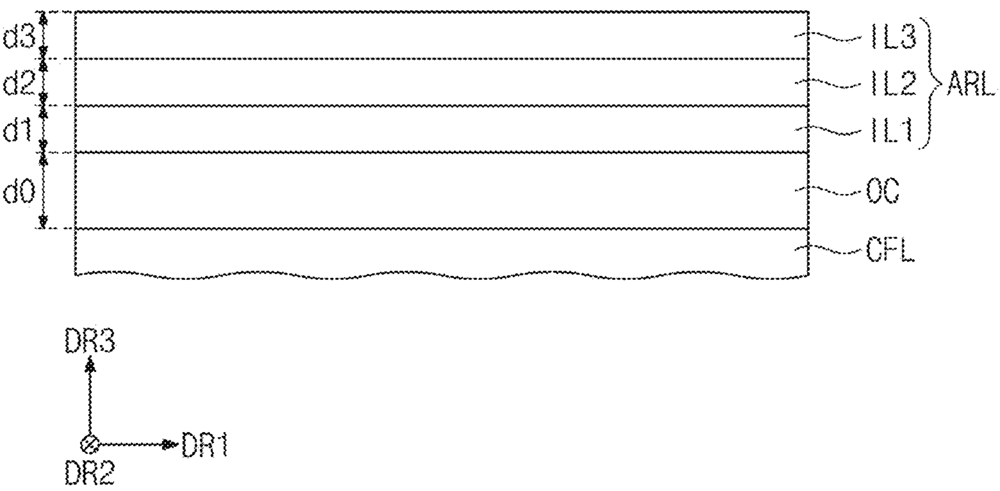
FIG. 5 is a cross-sectional view illustrating a partial configuration of a display module according to an embodiment of the disclosure.

FIG. 5 is a cross-sectional view illustrating a partial configuration of a display module according to an embodiment of the disclosure. In FIG. 5, a structure in which a color filter layer CFL, an overcoat layer OC, and an antireflection layer ARL are stacked is schematically illustrated. Hereinafter, the antireflection layer ARL of the disclosure will be described in detail with reference to FIG. 5.

Referring to FIGS. 4A and 5, the antireflection layer ARL is disposed on the overcoat layer OC and includes a plurality of layers. The antireflection layer ARL includes a first layer IL1 disposed on the overcoat layer OC, a second layer IL2 disposed on the first layer IL1, and a third layer IL3 disposed on the second layer IL2. The first layer IL1 may be disposed to be in contact with an upper surface of the overcoat layer OC, the second layer IL2 may be disposed to be in contact with an upper surface of the first layer IL1, and the third layer IL3 may be disposed to be in contact with an upper surface of the second layer IL2. An additional layer may not be provided on the third layer IL3. In such an embodiment, the third layer IL3 may be the outermost layer disposed on the uppermost portion of the antireflection layer ARL. An upper surface of the third layer IL3 may define the outermost surface of the antireflection layer ARL. The third layer IL3 may be the outermost layer of the display module DM1.

At least one selected from the first layer IL1, the second layer IL2, and the third layer IL3 includes an inorganic material. In an embodiment, the first layer IL1 and the second layer IL2 may include a silicon-based inorganic material. Each of the first layer IL1, the second layer IL2, and the third layer IL3 may include different materials from each other.

In an embodiment, the first layer IL1 includes silicon oxynitride (SiON). The first layer IL1 may be a layer formed of silicon oxynitride. In an embodiment, the second layer IL2 includes silicon nitride (SiNx). The second layer IL2 may be a layer formed of silicon nitride.

In an embodiment, the third layer IL3 includes polysilazane. The third layer IL3 may be a layer formed of polysilazane. The third layer IL3 may be a layer composed of polysilazane having a chain in which silicon and nitrogen atoms are alternately arranged as a basic skeleton or backbone chain.

The polysilazane included in the third layer IL3 may include at least one selected from the following first and second repeating units. In one embodiment, for example, polysilazane may include a first repeating unit, or may alternately include a first repeating unit and a second repeating unit.

[The First Repeating Unit]

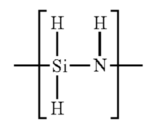

[The Second Repeating Unit]

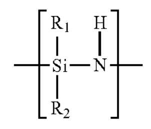

In the first repeating unit and the second repeating unit, each of $R_1$ and $R_2$ is independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 1 or greater to 30 or less carbon atoms, a substituted or unsubstituted alkenyl group having 2 or greater and 30 or less carbon atoms, a substituted or unsubstituted aryl group having 6 or greater and 30 or less ring carbon atoms, or a substituted or unsubstituted heteroaryl group having 2 or greater and 30 or less ring carbon atoms. In one embodiment, for example, each of $R_1$ and $R_2$ may independently be a hydrogen atom, a deuterium atom, a halogen atom, a substituted or unsubstituted ethenyl group, a substituted or unsubstituted ethanyl group, and a substituted or unsubstituted butynyl group. Each of $R_1$ and $R_2$ may independently be a hydrogen atom, an unsubstituted ethenyl group, an ethanyl group substituted with a halogen atom, or an unsubstituted butynyl group.

Herein, "substituted or unsubstituted" refers to substituted or unsubstituted with at least one substituent selected from a deuterium atom, a halogen atom, a cyano group, a nitro group, an amine group, a silyl group, a boron group, a phosphine oxide group, a phosphine sulfide group, an alkyl group, alkenyl group, an aryl group, and a heterocyclic group. In addition, each of the substituents described above may be substituted or unsubstituted. In one embodiment, for example, the biphenyl group may be interpreted as an aryl group, or may be interpreted as a phenyl group substituted with a phenyl group.

Herein, the halogen atom include a fluorine atom, a chlorine atom, a bromine atom, or an iodine atom, for example.

Herein, the alkyl group may be linear, branched or cyclic. The number of carbon atoms in the alkyl group is 1 or greater and 50 or less, 1 or greater and 30 or less, 1 or greater and 20 or less, 1 or greater and 10 or less, or 1 or greater and 6 or less. The alkyl group include a methyl group, an ethyl group, an n-propyl group, an isopropyl group, an n-butyl group, an s-butyl group, a t-butyl group, an 1-butyl group, a 2-ethylbutyl group, a 3, 3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2 -dimethylheptyl group, a 2-ethylheptyl group, a 2-butylheptyl group, an n-octyl group, a t-octyl group, a 2-ethyloctyl group, a 2-butyloctyl group, a 2-hexyl siloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-icosyl group, a 2-ethyl icosyl group, a 2-butyl icosyl group, a 2-hexyl icosyl group, a 2-octyl icosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group, for example, but is not limited thereto.

Herein, the alkenyl group may be linear or branched. The number of carbon atoms is not particularly limited, but is 2 or greater and 30 or less, 2 or greater and 20 or less, or 2 or greater and 10 or less. The alkenyl group include, but are not limited to, a vinyl group, a 1-butenyl group, a 1-pentenyl group, a 1,3-butadienyl aryl group, a styrenyl group, and a styrylvinyl group, for example.

Herein, the aryl group means any functional group or substituent group derived from an aromatic hydrocarbon ring. The aryl group may be a monocyclic aryl group or a polycyclic aryl group. The number of ring carbon atoms in the aryl group may be 6 or greater and 30 or less, 6 or greater and 20 or less, or 6 or greater and 15 or less. Examples of aryl groups include a phenyl group, a naphthyl group, a fluorenyl group, an anthracenyl group, a phenanthryl group, a biphenyl group, a terphenyl group, a quarterphenyl group, a quincphenyl group, a sexyphenyl group, a triphenylenyl group, a pyrenyl group, a benzofluoranthenyl group, and a chrysenyl group, but is not limited thereto.

Herein, the heteroaryl group may be a heteroaryl group including at least one selected from O, N, P, Si, and S as a heterogeneous element. The number of ring carbon atoms in the heteroaryl group is 2 or greater and 30 or less or 2 or greater and 20 or less. The heteroaryl group may be a monocyclic heteroaryl group or a polycyclic heteroaryl group. The polycyclic heteroaryl group may have, for example, a bicyclic or tricyclic structure. The heteroaryl group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phenoxazyl group, a phthalazinyl group, a pyrido pyrimidinyl group, a pyrido pyrazinyl group, a pyrazino pyrazinyl group, an isoquinoline group, an indole group, a carbazole group, an N-aryl carbazole group, an N-heteroaryl carbazole group, an N-alkylcarbazole group, a benzoxazole group, a benzoimidazole group, a benzothiazole group, a benzocarbazole group, a benzothiophene group, a dibenzothiophenyl group, a thienothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzosilol group, and a dibenzofuranyl group, for example, but are not limited thereto.

Polysilazane included in the third layer IL3 may be represented by the following Formula 1 or Formula 2.

[Formula 1]

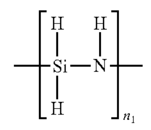

[Formula 2]

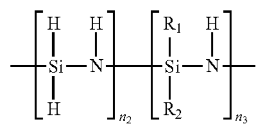

In Formula 1 or Formula 2, the same description as described above with reference to the first repeating unit and the second repeating unit may be applied to $R_1$ and $R_2$.

In Formula 1 and Formula 2, each of $n_1$ to $n_3$ is independently an integer of 10 or greater and 10,000 or less. In one embodiment, for example, each of $n_1$ to $n_3$ is independently an integer of 10 or greater and 4,000 or less.

In Formula 1 and Formula 2, a ratio of $n_2$ and $n_3$ may be 1.5:8.5 to 2.5:7.5. In one embodiment, for example, a ratio of $n_2$ and $n_3$ may be 2:8.

Each of the first layer IL1, the second layer IL2, and the third layer IL3 may have different refractive indices from each other. In an embodiment, the second layer IL2 may be a layer having a higher refractive index than the first layer IL1 and the third layer IL3. The third layer IL3 may be a layer having a lower refractive index than the first layer IL1 and the second layer IL2. In an embodiment, the refractive index of the first layer IL1 may be about 1.60 or greater and about 1.69 or less, the refractive index of the second layer IL2 may be about 1.70 or greater and about 1.90 or less, and the refractive index of the third layer IL3 may be about 1.35 or greater and about 1.45 or less. As each of the first layer IL1, the second layer IL2, and the third layer IL3 included in the antireflection layer ARL has the refractive index within the above range, the antireflection layer ARL may effectively prevent reflection of external light from the surface of the display module DM1 through destructive interference.

Each of the first layer IL1, the second layer IL2, and the third layer IL3 may have a thickness of about 50 nm or greater and about 150 nm or less. In an embodiment, the thickness d1 of the first layer IL1 may be about 60 nm or greater and about 80 nm or less, the thickness d2 of the second layer IL2 may be about 130 nm or greater and about 150 nm or less, and the thickness d3 of the third layer IL3 may be about 80 nm or greater and about 110 nm or less. As each of the first layer IL1, the second layer IL2, and the third layer IL3 included in the antireflection layer ARL has the thickness within the above range, the antireflection layer ARL may prevent external light from being reflected from the surface of the display module DM1, display efficiency may be prevented from deteriorating due to excessively thickening of the antireflection layer ARL, and an increase in tolerance between the antireflection layer ARL and the display panel DP may be prevented.

The antireflection layer ARL may have a low reflectivity and may have a high surface hardness. The reflectance on the upper surface of the antireflection layer ARL may be about 0.1% or less, and the surface hardness may be about 3H or greater. In one embodiment, for example, the reflectance on the upper surface of the antireflection layer ARL may be 0% or greater and about 0.03% or less. The surface hardness of the upper surface of the antireflection layer ARL may be about 4H. As the antireflection layer ARL includes the first layer IL1, the second layer IL2, and the third layer IL3 having different refractive indices from each other, reflection of external light may be effectively prevented, and the reflectance at the upper surface thereof may be decreased. In such an embodiment, the antireflection layer ARL may have a high surface hardness by including the third layer IL3 including polysilazane as the uppermost layer.

The overcoat layer OC for providing a base surface on which the antireflection layer ARL is disposed may have a larger thickness than each layer included in the antireflection layer ARL. In an embodiment, the overcoat layer OC may have a thickness d0 of about 3 μm or greater and about 10 μm or less. In such an embodiment, the overcoat layer OC may have a lower refractive index than the first layer IL1 and the second layer IL2. The overcoat layer OC may have a refractive index of about 1.45 or greater and about 1.53 or less.

In an embodiment of the display module, the antireflection layer provided on the display panel is a layer directly formed on the upper surface of the overcoat layer through deposition, not in a form of a film, the antireflection layer includes the plurality of layers having different refractive indices and the uppermost layer of the antireflection layer includes polysilazane. In such an embodiment, the surface of the antireflection layer positioned at the top of the display module may have low reflectivity and high surface hardness, and thus durability and visibility of the display module may be improved. In such an embodiment, the tolerance between the side surface of the antireflection layer and the side surface of the display panel in the display module may be reduced to allow the display module to be applied to a tiling display device.

Figure 6:
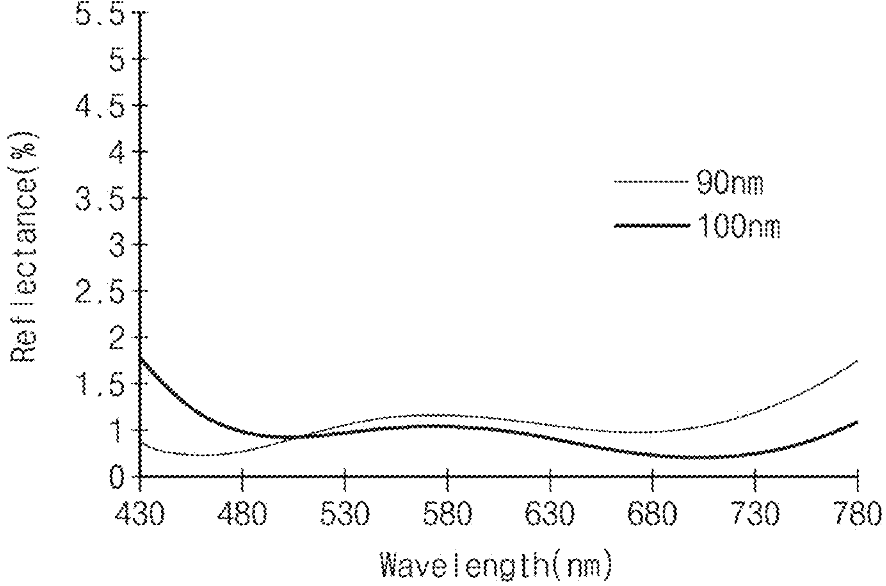
FIG. 6 is a graph illustrating reflectance of a surface of a display module according to an embodiment of the disclosure depending on a wavelength of light.
Figure 7A:
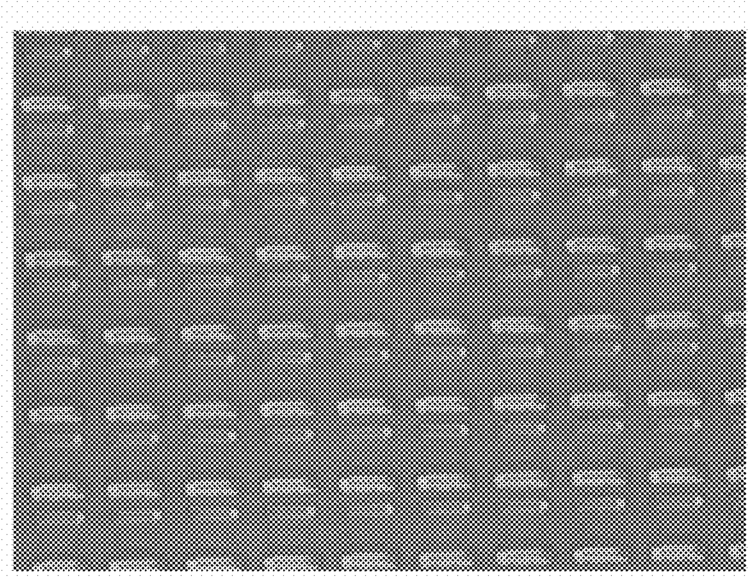
FIG. 7A is an image obtained by photographing a surface after performing surface hardness evaluation of a display module according to an Example of the disclosure.
Figure 7B:
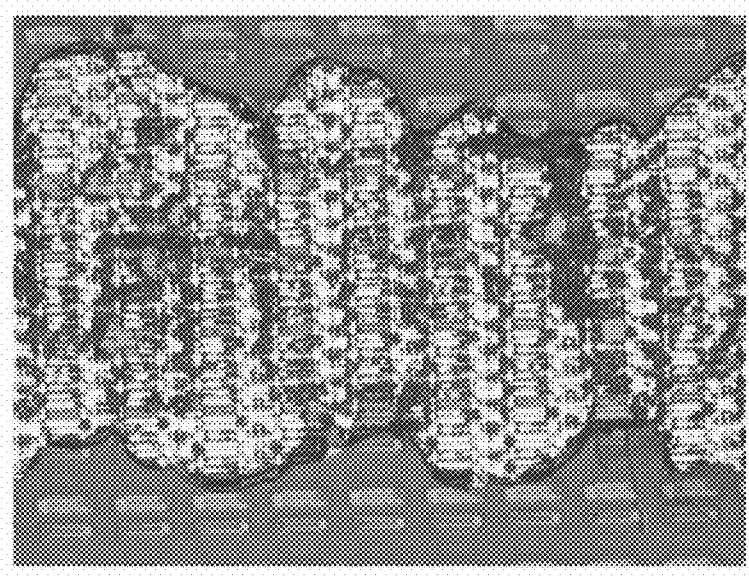
FIG. 7B is an image of a surface after performing surface hardness evaluation of a display module according to Comparative Example.

FIG. 6 is a graph illustrating reflectance of a surface of a display module according to an embodiment of the disclosure depending on a wavelength of light. FIG. 7A is an image obtained by photographing a surface after performing surface hardness evaluation of a display module according to an embodiment of the disclosure. FIG. 7B is an image of a surface after performing surface hardness evaluation of a display module according to comparative example.

As shown in FIG. 6, in an embodiment of a display module including an antireflection layer in which a first layer having a refractive index of 1.60 and a thickness of 70 nm is formed using silicon oxynitride on an overcoat layer, and a second layer having a refractive index of 1.83 and a thickness of 140 nm is formed using silicon nitride on the first layer, and a third layer having a refractive index of 1.39 and a thickness of 90 nm or 100 nm is formed using polysilazane on the second layer, surface light reflectance in a wavelength range of 430 nm to 780 nm was measured. FIG. 7A is an image photographing a surface of the display module including the antireflection layer including the first layer formed of silicon oxynitride, the second layer formed of silicon nitride, and the third layer formed of polysilazane as the uppermost part, after applying load of 500 grams (g) and applying a scratch with 4H pencil hardness. FIG. 7B is an image photographing a surface of a comparative example of a display module including a third layer formed of fluorinated polymer on the first layer and the second layer, after applying load of 500 g and applying a scratch with 2H pencil hardness.

As shown in FIG. 6, the third layers formed of polysilazane and having a thickness of 90 nm and a thickness of 100 nm have low light reflectance of 2% or less in the entire wavelength range of 430 nm to 780 nm. As shown in FIG. 6, an embodiment of the display module including the antireflection layer including the first layer formed of silicon oxynitride, the second layer formed of silicon nitride, and the third layer formed of polysilazane as the uppermost part has the low reflectivity in the range of 430 nm to 780 nm.

In FIGS. 7A and 7B, it may be seen that damage to the surface occurs even when scratching with the 2H pencil hardness in comparative example in which the third layer, which is the uppermost layer of the display module, is formed of the fluorinated polymer. However, it may be seen that no damage has occurred on the surface with a high pencil hardness of 4H in the embodiment in which third layer, which is the uppermost layer of the display module, is formed of polysilazane. Accordingly, an embodiment of the display module including the third layer formed of polysilazane at the top has the high surface hardness, thereby improving the durability of the display module According to embodiments of the disclosure, the tolerance between the antireflection layer and the display panel is minimized, the surface hardness of the display module is high and the reflectance is low, and thus the display module may be applied to a tiling display device. In such embodiments, the durability and visibility of the display device including the display module may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display module comprising:

a display panel;

an optical layer disposed on the display panel; and an antireflection layer disposed on the optical layer, wherein the antireflection layer includes:

a first layer in contact with an upper surface of the optical layer and including silicon oxynitride;

a second layer in contact with an upper surface of on the first layer and including silicon nitride; and a third layer in contact with an upper surface of the second layer and including polysilazane, wherein an upper surface of the third layer defines an outermost surface of the antireflection layer, wherein the first layer including silicon oxynitride, the second layer including silicon nitride, and the third layer including polysilazane collectively block reflection of external light through destructive interference, wherein a reflectance on an upper surface of the antireflection layer is about 2% or less, wherein a surface hardness of the upper surface of the antireflection layer is about 3H or greater, and wherein a tolerance between a side surface of the antireflection layer and a side surface of the display panel is about 30 μm or less.

2. The display module of claim 1, wherein a refractive index of the first layer is about 1.60 or greater and about 1.69 or less, wherein a refractive index of the second layer is about 1.70 or greater and about 1.90 or less, and wherein a refractive index of the third layer is about 1.35 or greater and about 1.45 or less.

3. The display module of claim 1, wherein a thickness of each of the first to third layers is about 50 nm or greater and about 150 nm or less.

4. The display module of claim 1, wherein the polysilazane includes at least one repeating unit selected from a first repeating unit and a second repeating unit, wherein the first repeating unit is a unit of the following formula:

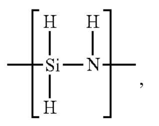

wherein the second repeating unit is a unit of the following formula:

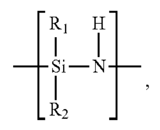

wherein each of $R_1$ and $R_2$ is independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 1 or about to 30 or less carbon atoms, a substituted or unsubstituted alkenyl group having 2 or about and 30 or less carbon atoms, a substituted or unsubstituted aryl group having 6 or about and 30 or less ring carbon atoms, or a substituted or unsubstituted heteroaryl group having 2 or about and 30 or less ring carbon atoms.

5. The display module of claim 1, wherein the polysilazane is represented by one of Formula 1

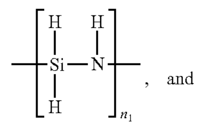

and

Formula 2

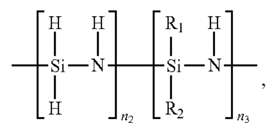

wherein each of $R_1$ and $R_2$ is independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 1 or greater to 30 or less carbon atoms, a substituted or unsubstituted alkenyl group having 2 or greater and 30 or less carbon atoms, a substituted or unsubstituted aryl group having 6 or greater and 30 or less ring carbon atoms, or a substituted or unsubstituted heteroaryl group having 2 or greater and 30 or less ring carbon atoms, and each of $n_1$, $n_2$, and $n_3$ is independently an integer of 10 or greater and 10,000 or less.

6. The display module of claim 1, further comprising:

a light control layer disposed between the display panel and the optical layer.

7. The display module of claim 6, wherein the display panel includes a plurality of light-emitting elements which generates a light, and wherein the light control layer includes:

a first light control unit which transmits the light as a first light;

a second light control unit which converts the light into a second light having a wavelength different from a wavelength of the first light; and a third light control unit which converts the light into a third light having a wavelength different from the wavelength of each of the first light and the second light.

8. The display module of claim 1, wherein the optical layer includes:

a color filter layer disposed on the display panel; and an overcoat layer disposed on the color filter layer, and wherein the antireflection layer is in contact with an upper surface of the overcoat layer.

9. The display module of claim 8, wherein a refractive index of the overcoat layer is about 1.45 or greater and about 1.53 or less, and wherein a thickness of the overcoat layer is about 3 μm or greater and about 10 μm or less.

10. A display module comprising:

a display panel;

an optical layer disposed on the display panel; and an antireflection layer disposed on the optical layer, wherein the optical layer includes:

a color filter layer including a plurality of color filter units; and an overcoat layer disposed on the color filter layer, and wherein the antireflection layer includes:

a first layer in contact with an upper surface of the overcoat layer and including silicon oxynitride;

a second layer in contact with an upper surface of the first layer including silicon nitride; and a third layer in contact with an upper surface of the second layer and including polysilazane, wherein an upper surface of the third layer defines an outermost surface of the antireflection layer, wherein the first layer including silicon oxynitride, the second layer including silicon nitride, and the third layer including polysilazane collectively block reflection of external light through destructive interference, wherein a reflectance on an upper surface of the antireflection layer is about 2% or less, wherein a surface hardness of the upper surface of the antireflection layer is about 3H or greater, and wherein a tolerance between a side surface of the antireflection layer and a side surface of the display panel is about 30 μm or less.

11. A tiling display device including a plurality of display modules arranged in at least one direction, wherein each of the plurality of display modules includes:

a display panel;

an optical layer disposed on the display panel; and an antireflection layer disposed on the optical layer, wherein the antireflection layer includes:

a first layer in contact with an upper surface of the optical layer and including silicon oxynitride;

a second layer in contact with an upper surface of the first layer and including silicon nitride; and a third layer in contact with an upper surface of the second layer and including polysilazane, wherein an upper surface of the third layer defines an outermost surface of the antireflection layer, wherein the first layer including silicon oxynitride, the second layer including silicon nitride, and the third layer including polysilazane collectively block reflection of external light through destructive interference, wherein a reflectance on an upper surface of the antireflection layer is about 2% or less, wherein a surface hardness of the upper surface of the antireflection layer is about 3H or greater, and wherein a tolerance between a side surface of the antireflection layer and a side surface of the display panel is about 30 μm or less.

12. The tiling display device of claim 11, wherein a tolerance between a side surface of the antireflection layer and a side surface of the display panel is 30 μm or less.

13. The tiling display device of claim 11, wherein a refractive index of the first layer is about 1.60 or greater and about 1.69 or less, Wherein a refractive index of the second layer is about 1.70 or greater and about 1.90 or less, and wherein a refractive index of the third layer is about 1.35 or greater and about 1.45 or less.

* * * * *